United States Patent
Billsberry

(10) Patent No.: US 11,356,134 B1
(45) Date of Patent: Jun. 7, 2022

(54) INTEGRATED TCAS/TRANSPONDER TRANSMITTER ARCHITECTURE

(71) Applicant: Rockwell Collins, Inc., Cedar Rapids, IA (US)

(72) Inventor: Mark A. Billsberry, Indialantic, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/149,197

(22) Filed: Jan. 14, 2021

(51) Int. Cl.
    H04B 1/59 (2006.01)
    H01Q 1/02 (2006.01)
    H03F 3/24 (2006.01)
    H04B 1/04 (2006.01)
    H01Q 1/28 (2006.01)
    H01P 5/02 (2006.01)

(52) U.S. Cl.
    CPC ............. *H04B 1/0483* (2013.01); *H01P 5/02* (2013.01); *H01Q 1/283* (2013.01); *H03F 3/245* (2013.01); *H03F 2200/451* (2013.01); *H04B 1/59* (2013.01)

(58) Field of Classification Search
    None
    See application file for complete search history.

(56) References Cited

U.S. PATENT DOCUMENTS

| | | | |
|---|---|---|---|
| 6,097,266 A * | 8/2000 | Nardozza | H01P 5/12 333/127 |
| 6,313,783 B1 | 11/2001 | Kuntman et al. | |
| 6,985,049 B2 * | 1/2006 | Hyoung | H03H 11/22 333/156 |
| 7,304,607 B2 | 12/2007 | Miyamoto et al. | |
| 7,436,350 B1 | 10/2008 | Maloratsky et al. | |
| 7,583,223 B2 | 9/2009 | Brandao et al. | |
| 8,933,836 B1 | 1/2015 | Woodell et al. | |
| 8,965,680 B2 | 2/2015 | Wang et al. | |
| 9,223,019 B2 | 12/2015 | Zeng et al. | |
| 9,806,394 B2 * | 10/2017 | Golcuk | H01P 5/185 |
| 9,857,461 B2 | 1/2018 | Stayton | |
| 10,101,447 B2 * | 10/2018 | Schulte | G01S 13/74 |
| 10,958,323 B1 * | 3/2021 | Ben-Yishay | H04B 7/0808 |
| 11,038,728 B1 * | 6/2021 | Hastings | H04L 27/144 |
| 2006/0030280 A1 * | 2/2006 | Anderson | H04B 7/0613 455/101 |
| 2008/0219246 A1 | 9/2008 | Siddiqui et al. | |
| 2009/0298451 A1 * | 12/2009 | Malaga | H04B 7/18506 455/129 |
| 2017/0358227 A1 * | 12/2017 | Troxel | G01S 13/74 |

* cited by examiner

Primary Examiner — Pablo N Tran
(74) Attorney, Agent, or Firm — Suiter Swantz pc llo

(57) ABSTRACT

A transmitter for an aircraft is disclosed. The transmitter comprises a first channel configured to transmit first radio frequency (RF) signals in a first direction and a second channel configured to transmit second RF signals in a second direction. A branchline coupler is communicatively coupled to the first channel and the second channel. The branchline coupler comprises one or more quarter wave transformers and a set of PIN diode switches configured to have a high impedance responsive to the transmitter being in an amplitude-based mode and a low impedance responsive to the transmitter being in a phase-based mode.

7 Claims, 6 Drawing Sheets

US 11,356,134 B1

INTEGRATED TCAS/TRANSPONDER TRANSMITTER ARCHITECTURE

SUMMARY

A transmitter for an aircraft is disclosed in accordance with one or more illustrative embodiments of the present disclosure. In one illustrative embodiment, the transmitter comprises a first channel. The first channel comprises a first input port, one or more first power amplifiers configured to receive first outgoing signals from the first input port and amplify the first outgoing signals, and a first antenna port configured to receive the first outgoing signals from the first power amplifier(s), and transmit first radio frequency (RF) signals in a first direction. In another illustrative embodiment, the transmitter comprises a second channel. The second channel comprises a second input port, one or more second power amplifiers configured to receive second outgoing signals from the second input port and amplify the second outgoing signals, and a second antenna port configured to receive the second outgoing signals from the second power amplifier(s), and transmit second RF signals in a second direction. In another illustrative embodiment, the transmitter comprises a first branchline coupler communicatively coupled to the first channel and the second channel. The first branchline coupler comprises one or more first quarter wave transformers and a first set of p-type i-type n-type (PIN) diode switches. The first set of PIN diode switches is configured to have a high impedance to transmit at least one of the first outgoing signals or the second outgoing signals to form a first radiating beam or a second radiating beam responsive to the transmitter being in an amplitude-based mode. The first set of PIN diode switches is configured to have a low impedance and transmit the first outgoing signals to the first antenna port and the second outgoing signals to the second antenna port responsive to the transmitter being in a phase-based mode.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
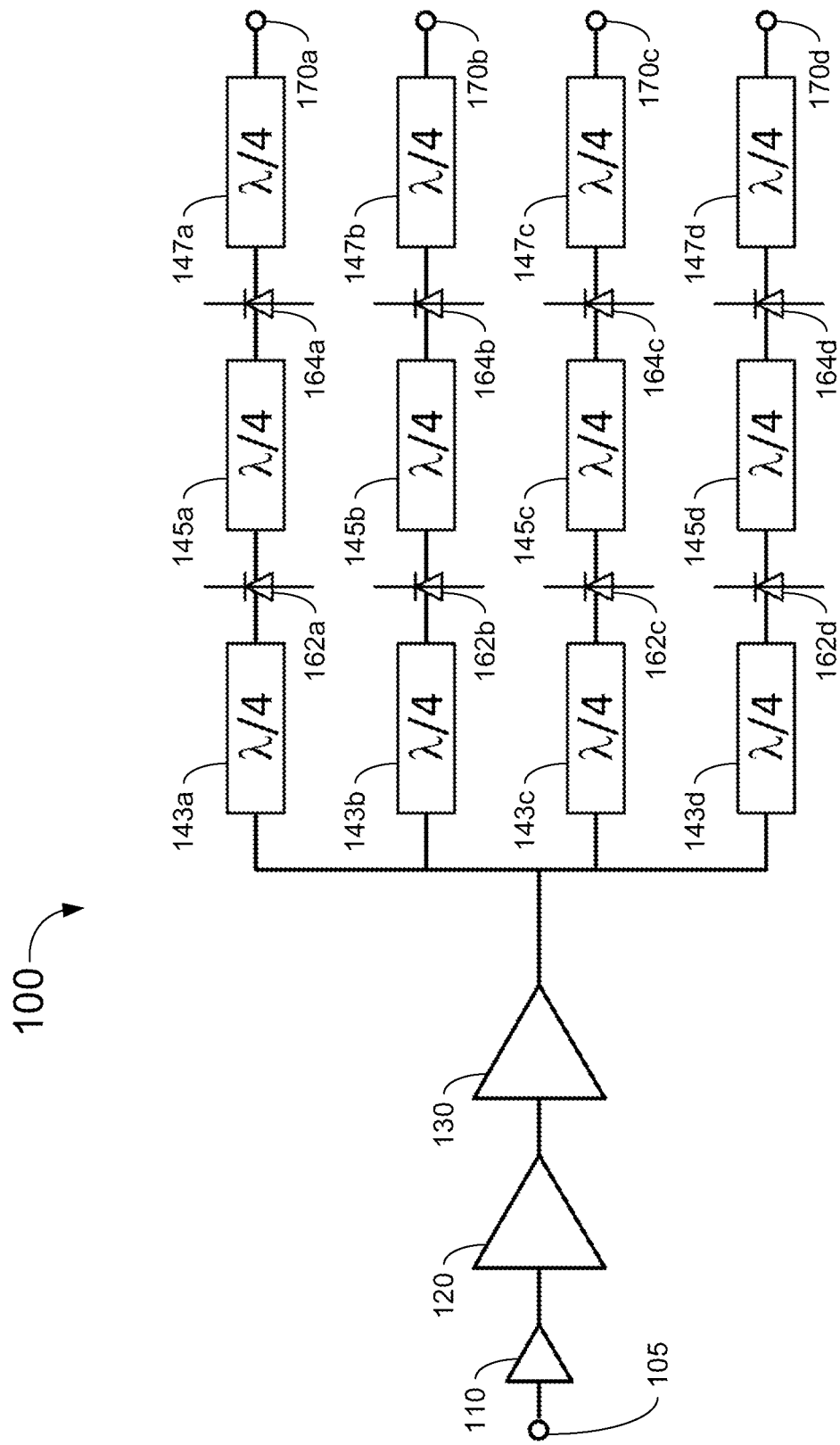
FIG. 1 is a diagram view of a conventional amplitude-based transmitter for an aircraft transponder.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the present disclosure, numerous specific details are set forth in order to provide a more thorough understanding of the inventive concepts. However, it will be apparent to one of ordinary skill in the art having the benefit of the present disclosure that the inventive concepts disclosed herein may be practiced without these specific details. In other instances, well-known features may not be described in detail to avoid unnecessarily complicating the present disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination or sub-combination of two or more such features, along with any other features which may not necessarily be expressly described or inherently present in the present disclosure.

Traffic Collision Avoidance Systems (TCASs), also known as Aircraft or Airborne Collision Avoidance Systems (ACASs), operate with airborne transponders onboard protected aircraft. The TCAS periodically transmit interrogation signals to be received by transponders onboard other aircraft (e.g., target aircraft) in the vicinity of the protected aircraft. In reply to the interrogation signals (e.g., request signals), the target aircraft's transponder transmits a response signal. The typical transponder receiver receives the TCAS interrogation at 1030 MHz signals and transmits the reply at 1090 MHz signals. The TCAS equipment aboard the protected aircraft determines the range of the target aircraft by calculating the round trip time between transmission of the interrogation signal and reception of the response signal.

A transponder is an airborne transmitter-receiver (i.e., transceiver) component of air traffic control Radar Beacon System mode A and mode C interrogations as well as mode S interrogations. A transponder sends an identifying coded signal in response to a received interrogation from a ground-based radar station or airborne TCAS system to locate and identify the aircraft. Reply signals from the transponder are used to generate displays of the replying aircraft identification, position, altitude, velocity, rate of altitude change, etc.

Conventional airborne TCASs include two different approaches to form directional transmitter antenna patterns and angle of arrival determination: phase-based bearing estimation (e.g., phase-based TCAS) and amplitude comparing bearing estimation (amplitude-based TCAS). An example of an amplitude-based system is the ISS-2100 and an example of a phase-based system is the TTR-2100, both developed by Rockwell Collins, Inc. (Cedar Rapids, Iowa). Developing and maintaining two TCAS platforms is prohibitively expensive, since both platforms need to be extensively updated in order to enable modern TCAS/ACAS standards such as ACAS-X.

Additionally, transitioning to a single platform (either amplitude or phase-based) for future applications is problematic since customers are required to change out their TCAS antennas from existing aircraft. Selecting a single platform is also problematic since both platforms have disadvantages. Thus, there is a need for a solution that advantageously integrates both platforms to reduce development and customer support burdens and is compatible with both phase and amplitude based antennas.

FIG. 1 is a diagram view of a conventional amplitude-based transmitter 100 (e.g., phased array) for an aircraft TCAS. The angle-of-arrive is calculated by comparing the amplitudes of the signals received from each channel (e.g., a first amplitude for the forward direction, a second amplitude for the aft direction, etc.). Driver amplifiers 110 and 120 and a power amplifier 130 are configured to receive outgoing signals from an input port 105 and amplify the outgoing signals. Quarter wave transformers 143a-d, 145a-d, and 147a-d apply an impedance transform and a 90° phase-shift to the outgoing signals. Switches 162a-d and 164a-d control which of the output ports 170a-d (e.g., antenna ports) transmits the outgoing signals. Each of the output ports 170a-d is communicatively coupled to a passive beamforming network (e.g., Butler matrix). The directional beam may then be transmitted by a radiating element of an antenna. The beam direction is controlled by switching between the four outputs ports 170a-d (e.g., after the outgoing signals are amplified by the single set of amplifiers 110, 120 and 130). In this way, four directional beams are produced.

Advantages of the conventional amplitude-based approach include cable phase calibration not being required and a single set of transmitter amplifiers (e.g., a single transmit channel). One disadvantage of the amplitude-based approach is the requirement of a 1-to-4 beam select switch for switching between the multiple output ports (e.g., antenna ports) which causes significant loss and increases power amplifier requirements. A single high power transmitter and switch is challenging to implement and has reliability issues, especially when mismatched (e.g., by impedance). Another disadvantage is the difficulty meeting the transponder A2 (250 Watt) requirement and the A3 (400 Watt) requirement. Additionally, the amplitude-based approach antenna is expensive since it requires a passive beam forming network (e.g., Butler matrix) and internal high power PIN diode switches for an omnidirectional beam. Furthermore, angle-of-arrive measurements are not as accurate as a phase-based system causing significant bearing errors on displayed targets.

Figure 2:
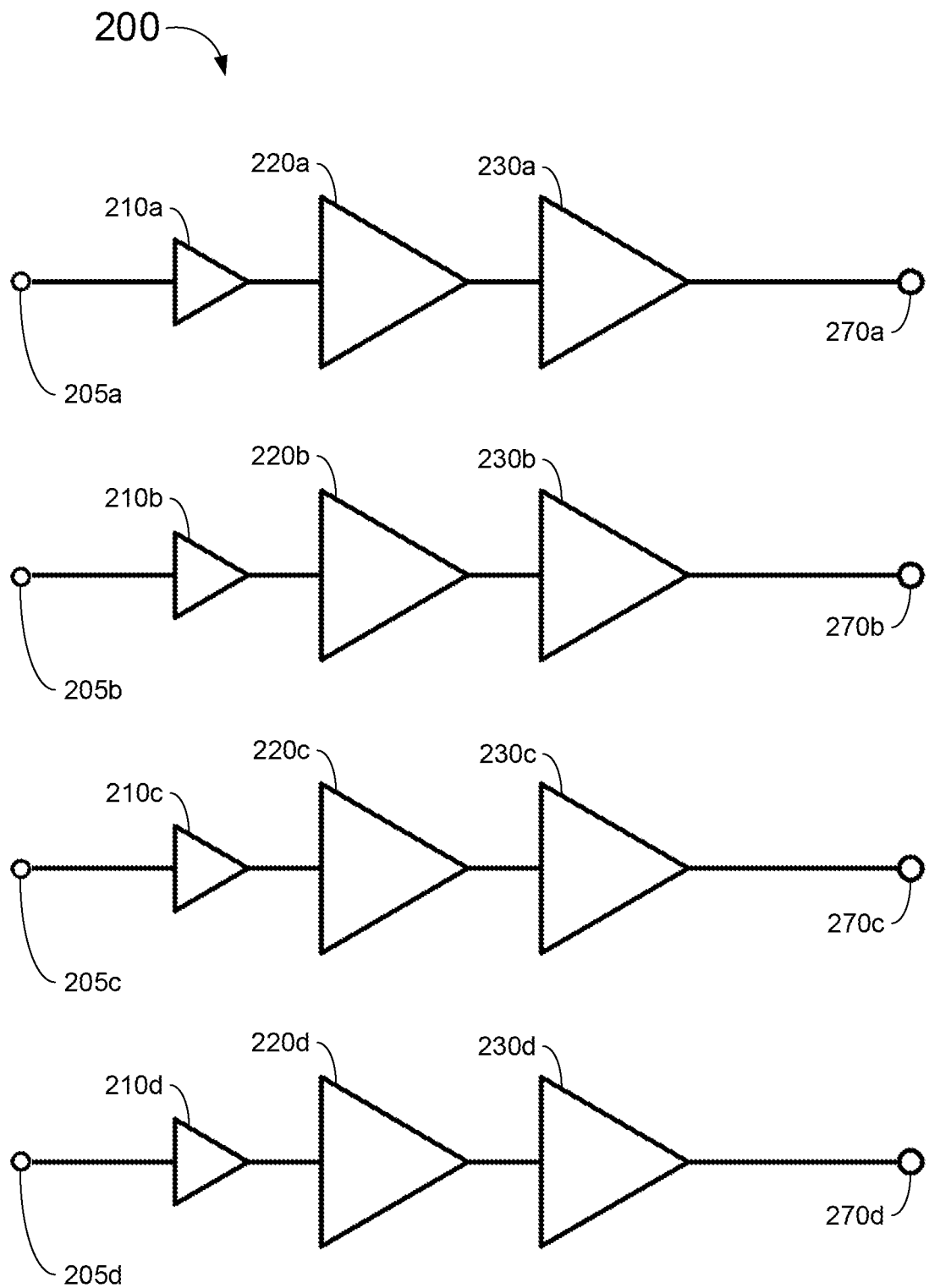
FIG. 2 is a diagram view of a conventional phase-based transmitter for an aircraft transponder.

FIG. 2 is a diagram view of a conventional phase-based transmitter 200 for an aircraft transponder. Phase-based TCAS utilizes four smaller transmitter/power amplifiers with digital beam forming. The angle-of-arrive is calculated by comparing the phases of the signals received from each channel (e.g., a first phase for the forward element, a second phase for the aft element, etc.). Each channel includes a respective set of driver amplifiers 210a-d and 220a-d and power amplifiers 230a-d configured to receive respective outgoing signals from the input ports 205a-d and amplify the outgoing signals. The relative phase of the four transmitters (sets of amplifiers) is adjusted in the digital domain to create the required beam.

Advantages of the phase-based approach include the use of four low-power transmitters (highly reliable), the omnidirectional beam requiring no additional hardware, the easier path to the A3 power requirement, and improved bearing accuracy. The phase-based approach presents several disadvantages. For one, it requires a complex cable calibration algorithm to determine the relative electrical length of each of the four RF cables between the TCAS radio and the antenna. Additionally, the phase-based approach does not support a single, directional top antenna with a bottom omnidirectional blade antenna without additional circuitry. This limitation is highly undesirable since about 40% of current ACAS configurations include a single directional antenna on the top of the aircraft with an omnidirectional blade antenna (e.g., omni-blade) on the bottom of the aircraft. Since the omni-blade is only connected to one of the four sets of power amplifiers, the power into the omni-blade is one quarter of the power into the directional antenna. In the near future, the ADS-B standard may make the dual directional antenna obsolete since the dual-directional antenna adds a significant addition of weight, drag and cost.

Embodiments of the present disclosure are directed to a TCAS transmitter architecture that advantageously integrates both the phase-based and amplitude-based platforms. The present transmitter supports amplitude-based TCAS antennas for backwards compatibility, supports phase-based TCAS antennas (the preferred TCAS solution for all future traffic products), and supports bottom omni-blade antenna operation. In this way, aircraft that are currently equipped with either the phase-based platform or the amplitude-based platform do not require a complicated change of existing hardware or software.

Figure 3:
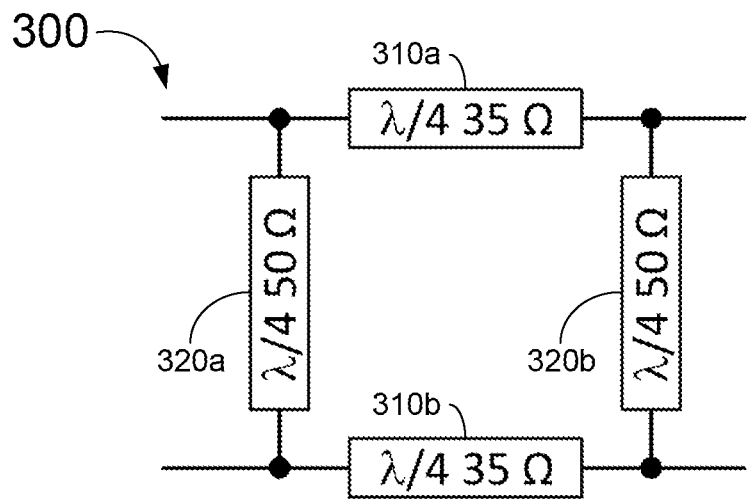
FIG. 3 is a diagram view of a conventional branchline coupler.
Figure 4:
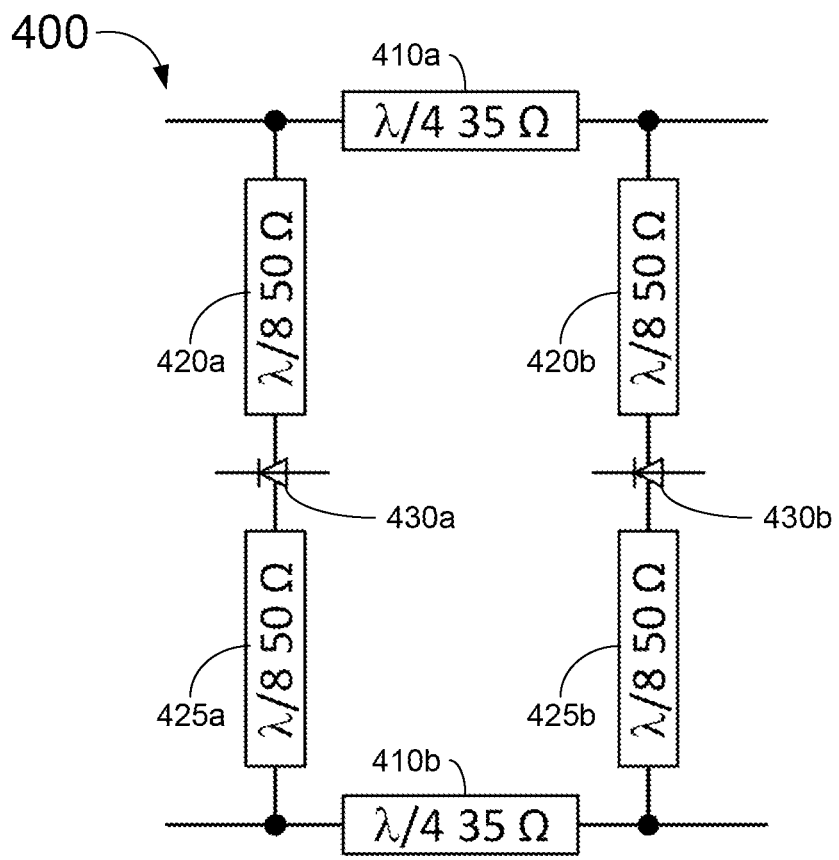
FIG. 4 is a diagram view of a switched branchline coupler, in accordance with one or more embodiments of the present disclosure.

FIG. 3 is a diagram view of a conventional branchline coupler 300 including quarter wave transformers 310a and 310b on 35Ω lines and quarter wave transformers 320a and 320b on 50Ω lines. In contrast, FIG. 4 is a diagram view of a branchline coupler 400 that may be used with the present transmitter, in accordance with one or more embodiments of the present disclosure. The branchline coupler 400 may include quarter wave transformers 410a and 410b on 35Ω lines and quarter wave transformers 420a-b and 425a-b on 50Ω lines. Shunt p-type i-type-n-type (PIN) diode switches 430a-b may be inserted at the midpoint of each of the two 50Ω lines. When PIN diode switches 430a-b have a high impedance, the circuit behaves like a standard branchline coupler. When the PIN diode is forward biased to create a short circuit, the coupler 400 is effectively bypassed but maintains the correct 50Ω match over the required pass band.

The PIN diode switches 430a-b may be diodes with a wide, undoped intrinsic (i-type) semiconductor region between a p-type semiconductor and an n-type semiconductor region. The p-type and n-type regions may be doped for use as Ohmic contacts. Under zero- or reverse-bias (the "off" state), a PIN diode has a low capacitance which does not pass an RF signal. Under a forward bias (the "on" state), a PIN diode may be an effective conductor of RF signals and allows them to pass. The PIN diode switches 430a-b may be controlled by a computer (e.g., coupler) such that a bias current controls the on and off states. Although RF relays can alternatively be used as switches, they switch relatively slowly (on the order of tens of milliseconds). In contrast, the PIN diode switches 430a-b may switch relatively quickly (e.g., 1 microsecond), although at lower RF frequencies, the switching times may have a different order of magnitude as the RF period.

Figure 5:
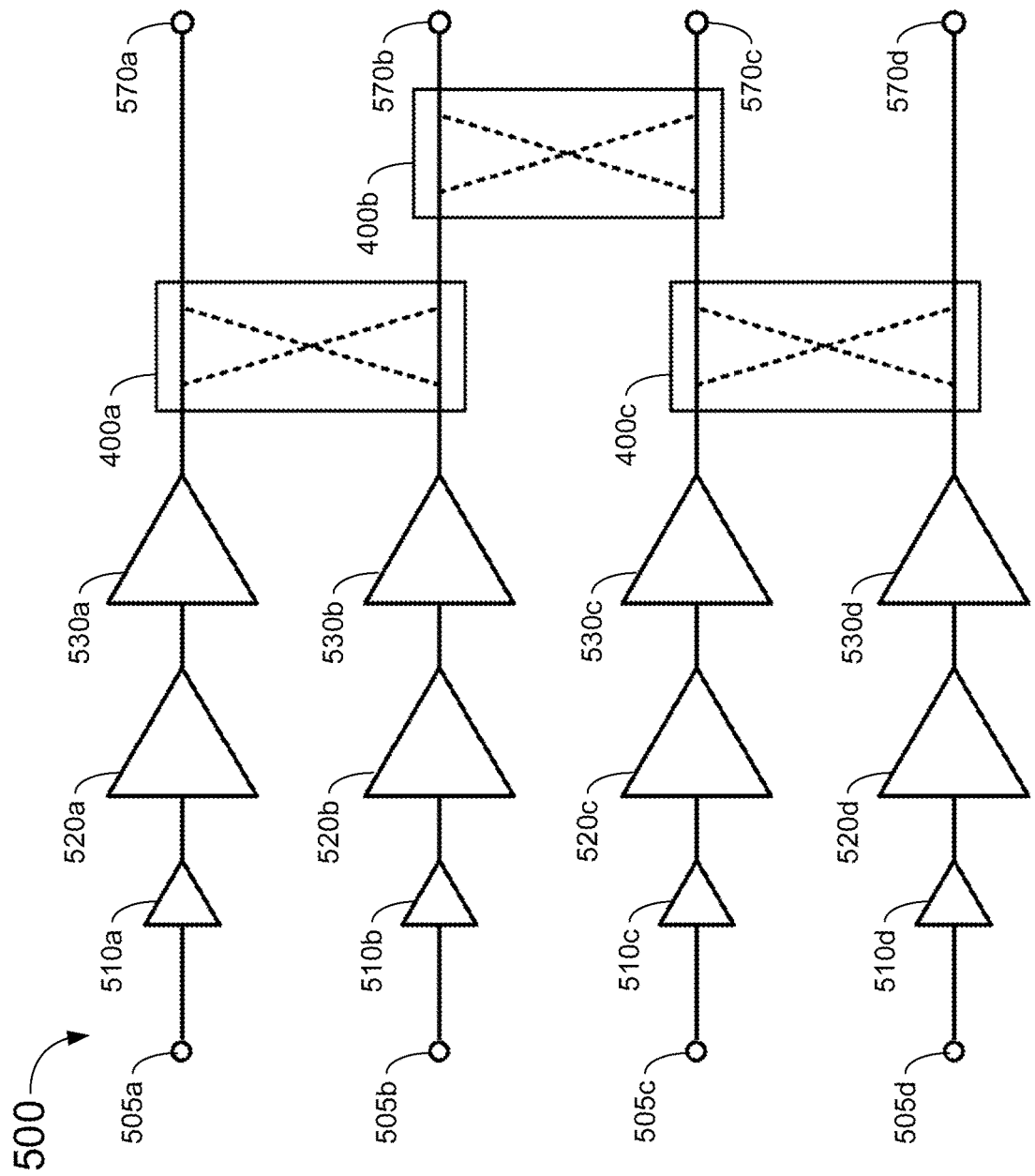
FIG. 5 is a diagram view of a transmitter for an aircraft transponder including both a phase-based mode and an amplitude-based mode, in accordance with one or more embodiments of the present disclosure.

FIG. 5 is a diagram view of a transmitter 500 for an aircraft (e.g., a TCAS transceiver and/or transponder). The transmitter may comprise a first channel, a second channel, a third channel, and a fourth channel, although the present disclosure is not limited to any particular number of channels. Each channel may include respective input ports 505a-d, one or more drive and power amplifiers 510a-d, 520a-d, and 530a-d configured to receive outgoing signals from the input ports 505a-d and amplify the outgoing signals, and output ports 570a-d configured to be coupled to radiating elements (e.g., antennas; not shown). The radiating elements may be configured to receive the respective outgoing signals from the amplifier(s) 530a-d and transmit radio frequency (RF) signals in a respective direction (e.g., forward, aft, left, right, etc.) It is noted that the direction may be, for example, an azimuthal direction from the protected aircraft. In some embodiments, the transmitter 500 may be able to transmit the combined power from all four power amplifiers 530a-d from a single port (e.g., connected to a blade antenna). The transmitter 500 may include branchline couplers 400a-d that are substantially similar or substantially identical to the branchline coupler 400 described with respect to FIG. 4. The branchline couplers 400a-d may communicatively couple the channels such that signal transmission may be controlled between each channel.

Figure 6:
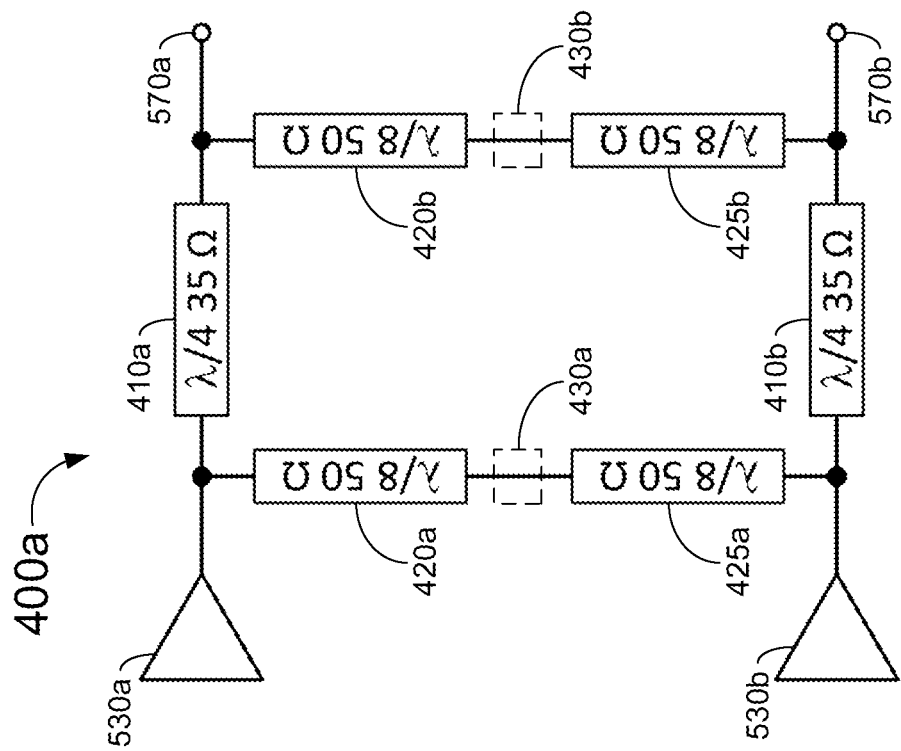
FIG. 6 is a diagram view of a switched branchline coupler in a phase-based mode, in accordance with one or more embodiments of the present disclosure.

For example, as shown in FIG. 6, when the transmitter 500 is in a phase-based mode, the PIN diode switches 430a-b of coupler 400a may be configured to have a low impedance (e.g., by connecting the circuit to ground) and transmit the first outgoing signals of the first channel to the first antenna port, and the second outgoing signals of the second channel to the second antenna port, etc. During the phase-based mode, the output RF beams are controlled with a digital beam former to adjust the relative phase of the four channels.

Figure 7:
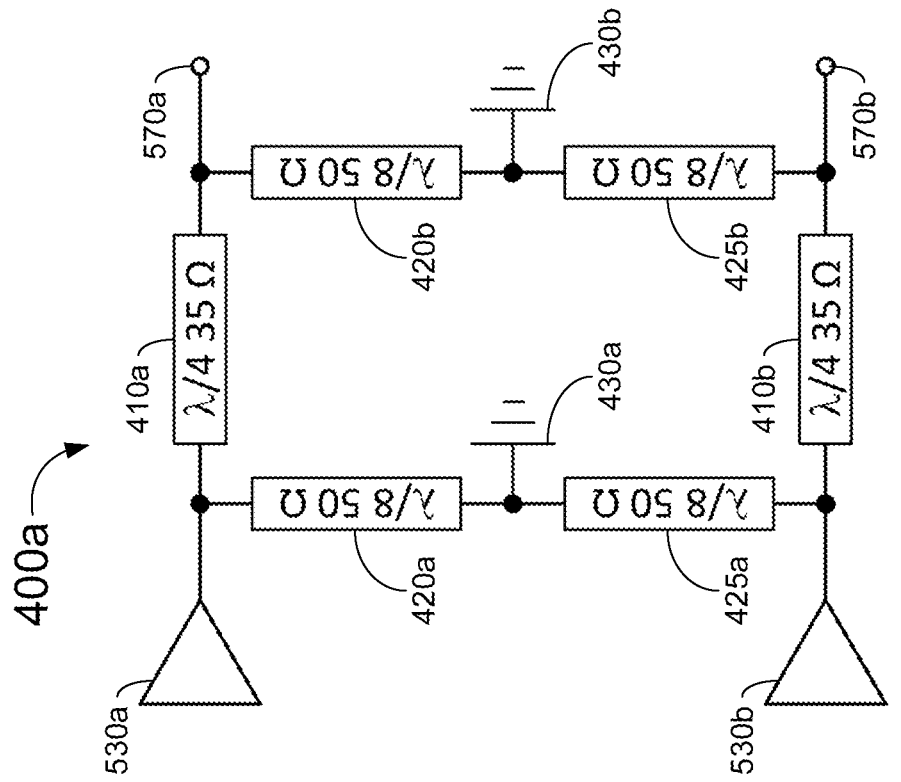
FIG. 7 is a diagram view of a switched branchline coupler in an amplitude-based mode, in accordance with one or more embodiments of the present disclosure.

As shown in FIG. 7, when the transmitter 500 is in an amplitude-based mode, the PIN diode switches 430a-b of coupler 400a may be configured to have a high impedance to transmit the first outgoing signals of the first channel to the first antenna port or the second antenna port, or the second outgoing signals of the second channel to the second antenna port or the first antenna port. To direct the RF beam out of the correct port, the relative phase of the outgoing signals at the amplifiers (e.g., amplifiers 530a-b) may be adjusted. It is noted that the branchline couplers 400b and 400c may be substantially identical or substantially similar in structure and function to the branchline coupler 400a. For example, the branchline coupler 400b may communicatively couple the second channel and the third channel, and the branchline coupler 400c may communicatively couple the third channel and the fourth channel. In some embodiments, each of the output ports 570a-d is communicatively coupled to a passive beamforming network (e.g., Butler matrix) when the transmitter 500 is in an amplitude-based mode.

In some embodiments, a controller (e.g., computer or computing system) including one or more processors and a memory may be communicatively coupled to the transmitter. Program instructions may be stored on the memory, that, when executed by the one or more processors, cause the one or more processors to perform functions, procedures, algorithms, methods, etc. described in the present disclosure. For example, in some embodiments, the controller may control the on-state and the off-state of the transmitter 500 by applying a bias current to the PIN diode switches of the branchline couplers 400a-c. In some embodiments, the controller may adjust the phase of outgoing signals using digital beamforming (e.g., during the phase-based mode) or may adjust the phase of the outgoing signals at the amplifiers 530a-d (e.g., during the amplitude-based mode).

Figure 8:
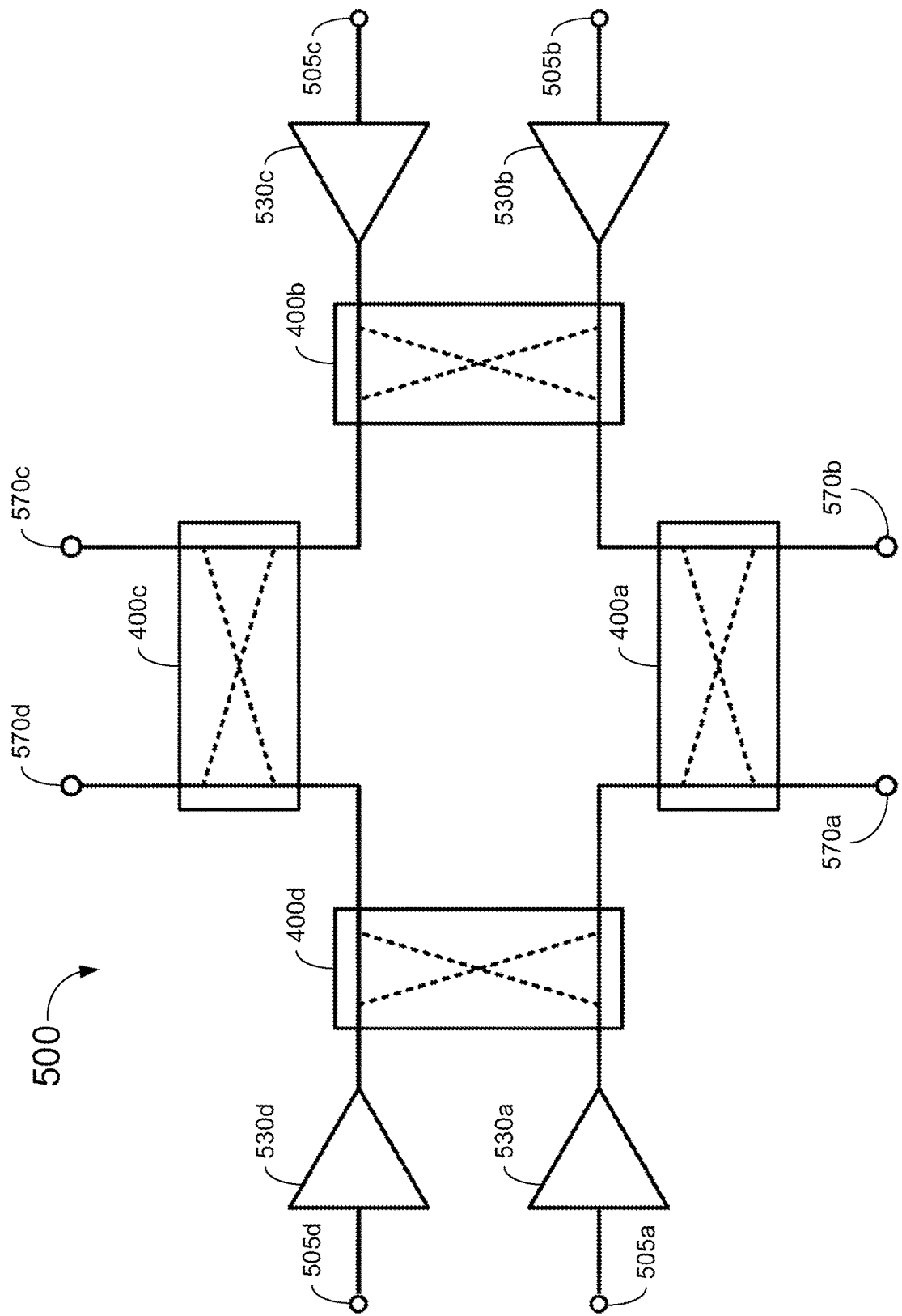
FIG. 8 is a diagram view of an alternative of the transmitter shown in FIG. 5, in accordance with one or more embodiments of the present disclosure.

FIG. 8 is a diagram view of an alternative transmitter 500. In some embodiments, the transmitter 500 may include a fourth branchline coupler 400d that is substantially similar or substantially identical in form and function to the branchline couplers 400a-c described with respect to FIG. 5. The fourth branchline coupler 400d may communicatively couple the first channel and the fourth channel. In this way, the alternative configuration of the transmitter 500 enables all four power amplifiers 530a-d to be combined and transmitted out of any of the four output ports 570a-d during the amplitude-based mode, or directly connected to their respective output port 570a-d during the phase-based mode.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A transmitter for an aircraft, comprising:
   a first channel, comprising:
     a first input port,
     one or more first power amplifiers configured to receive first outgoing signals from the first input port and amplify the first outgoing signals, and
     a first antenna port configured to receive the first outgoing signals from the first power amplifier(s), and transmit first radio frequency (RF) signals in a first direction,
   a second channel, comprising:
     a second input port,
     one or more second power amplifiers configured to receive second outgoing signals from the second input port and amplify the second outgoing signals, and a second antenna port configured to receive the second outgoing signals from the second power amplifier(s), and transmit second RF signals in a second direction, a first branchline coupler communicatively coupled to the first channel and the second channel, comprising:
one or more first quarter wave transformers, and
a first set of p-type i-type n-type (PIN) diode switches,
wherein the first set of PIN diode switches is configured to have a high impedance to transmit at least one of the first outgoing signals or the second outgoing signals to the first antenna port or the second antenna port responsive to the transmitter being in an amplitude-based mode,
wherein the first set of PIN diode switches is configured to have a low impedance and transmit the first outgoing signals to the first antenna port and the second outgoing signals to the second antenna port responsive to the transmitter being in a phase-based mode.

2. The transmitter of claim 1, further comprising:
a third channel, comprising:
a third input port,
one or more third power amplifiers configured to receive third outgoing signals from the third input port and amplify the third outgoing signals, and
a third antenna port configured to receive the third outgoing signals from the third power amplifier(s), and transmit third RF signals in a third direction, a second branchline coupler communicatively coupled to the second channel and the third channel, comprising:
one or more second quarter wave transformers, and
a second set of PIN diode switches,
wherein the second set of PIN diode switches is configured to have a high impedance to transmit at least one of the second outgoing signals or the third outgoing signals to the second antenna port or the third antenna port responsive to the transmitter being in an amplitude-based mode,
wherein the second set of PIN diode switches is configured to have a low impedance to transmit the second outgoing signals to the second antenna port and the third outgoing signals to the third antenna port responsive to the transmitter being in a phase-based mode.

3. The transmitter of claim 2, further comprising:
a fourth channel, comprising:
a fourth input port,
one or more fourth power amplifiers configured to receive fourth outgoing signals from the fourth input port and amplify the fourth outgoing signals, and a fourth antenna port configured to receive the fourth outgoing signals from the fourth power amplifier(s), and transmit fourth radio frequency (RF) signals in a fourth direction, a third branchline coupler communicatively coupled to the third channel and the fourth channel, comprising:
one or more third quarter wave transformers, and
a third set of PIN diode switches,
wherein the third set of PIN diode switches is configured to have a high impedance to transmit at least one of the third outgoing signals or the fourth outgoing signals to the third antenna port or the fourth antenna port responsive to the transmitter being in an amplitude-based mode,
wherein the third set of PIN diode switches is configured to have a low impedance to transmit the third outgoing signals to the third antenna port and the fourth outgoing signals to the fourth antenna port responsive to the transmitter being in a phase-based mode.

4. The transmitter of claim 3, comprising a fourth branchline coupler communicatively coupled to the first channel and the fourth channel, wherein the fourth branchline coupler comprises:
one or more fourth quarter wave transformers, and
a fourth set of PIN diode switches,
wherein the fourth set of PIN diode switches is configured to have a high impedance to transmit at least one of the first outgoing signals or the fourth outgoing signals to the first antenna port or the fourth antenna port responsive to the transmitter being in an amplitude-based mode,
wherein the fourth set of PIN diode switches is configured to have a low impedance to transmit the first outgoing signals to the first antenna port and the fourth outgoing signals to the fourth antenna port responsive to the transmitter being in a phase-based mode.

5. The transmitter of claim 4, wherein the first direction is forward of the aircraft, the second direction is right of the aircraft, the third direction is aft of the aircraft, and the fourth direction is left of the aircraft.

6. The transmitter of claim 4, wherein the transmitter being in the phase-based mode connects the first set of PIN diode switches, the second set of PIN diode switches, the third set of PIN diode switches, and the fourth set of PIN diode switches to ground.

7. The transmitter of claim 4, wherein at least one of the first antenna port, the second antenna port, the third radiating antenna port, or the fourth antenna port is connected to a blade antenna.

* * * * *